United States Patent [19]

Leibowitz et al.

[11] 3,805,031

[45] Apr. 16, 1974

[54] COUNT AND STORE SYNCHRONOUS BINARY COUNTER

[75] Inventors: Lawrence M. Leibowitz, Fairfax, Va.; Richard K. Baldauf, Greenbelt, Md.; Thomas T. Street, Woodbridge, Va.

[73] Assignee: The United States of America as represented by the Secretary of the Navy, Washington, D.C.

[22] Filed: Sept. 25, 1972

[21] Appl. No.: 292,203

[52] U.S. Cl. ...... 235/92 EA, 235/92 R, 235/92 LG, 235/92 PE

[51] Int. Cl. ........ H03k 21/12

[58] Field of Search ........ 235/92 EA, 92 EC

[56] References Cited

UNITED STATES PATENTS

| | | | |
|---|---|---|---|
| 3,602,699 | 8/1971 | Kamachi | 235/92 EA |
| 3,597,641 | 8/1971 | Ayres | 235/92 EA |
| 3,063,631 | 11/1962 | Ray | 235/92 EA |

*Primary Examiner*—Paul J. Henon
*Assistant Examiner*—Robert F. Gnuse
*Attorney, Agent, or Firm*—R. S. Sciascia; Arthur L. Branning; Robert E. O'Neill

[57] ABSTRACT

An improvement in a count and store binary counter system wherein the count is available immediately after the reception of the counting clock pulse. Thus, there is no need to wait for a successive ripple-through, and the possibility of erroneous outputs due to an intermediate ripple-through state is eliminated. The circuitry employed to accomplish the invention includesq among other things, a ripple-through binary counter coupled to an n-bit parallel register.

2 Claims, 6 Drawing Figures

COUNT AND STORE SYNCHRONOUS BINARY COUNTER

BACKGROUND OF THE INVENTION

A basic binary counter, constructed of D-type flip-flops, produces a non-uniform delay in reaching the final state of a particular count. This occurs because of the necessity for the effect of an up-date pulse to ripple-through the various counter stages. As a result, transition states are created and can be recognized by the external circuitry controlled by the counter causing erroneous responses.

Many attempts have been made to improve the effectiveness of the binary counter. A well known development results from simple mapping techniques that utilize flip-flops and a multitude of logic gates. Unfortunately as the counter is made larger the number of required logic gates grows to greater proportions than the number counter stages.

Considering such drawbacks we have developed a simple, inexpensive, straight forward counter which completes all bit transitions and thus state transitions within one flip-flop delay of the count stimulus.

SUMMARY OF THE INVENTION

The invention includes an $n$-bit ripple through binary counter coupled to an $n$-bit parallel register each having a clock and reset inputs. The device is connected in such a manner that a reset input sets the LSB stage of the binary counter to a 1, sets the remaining stages at 0 and sets the stages of the $n$-bit parallel register to 0. When a clock pulse to be counted arrives at the counter, two separate functions occur simultaneously. First the $n$-bit parallel register changes state and provides an immediate read-out of the previous count in the ripple through counter, as increased by 1. Secondly, the ripple through begins to take place in the counter without any effect on the $n$-bit register since a read-out had already been obtained.

OBJECTS OF THE INVENTION

It is an object of the present invention to provide a simple binary counter technique which results in a synchronous transition between all counter states.

Another object of this invention is to provide a device capable of completing all bit transitions within one flip-flop delay of the count stimulus.

Other objects and advantages will become apparent from the following detailed description of the invention when considered in conjunction with the accompanying drawings.

DRAWINGS

FIG. 1, prior art, is a basic 4 bit binary counter made of D-type flip-flops;

FIG. 2, prior art, is essentially the simple counter of FIG. 1 modified with additional circuitry to alleviate the flip-flop ripple-through delay times;

DETAILED DESCRIPTION

Figure 1:
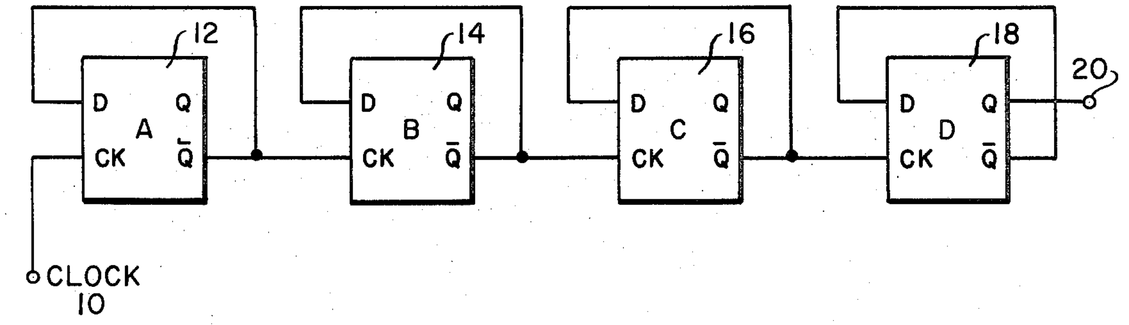
FIG. 1. PRIOR ART
Figures 3, 4:
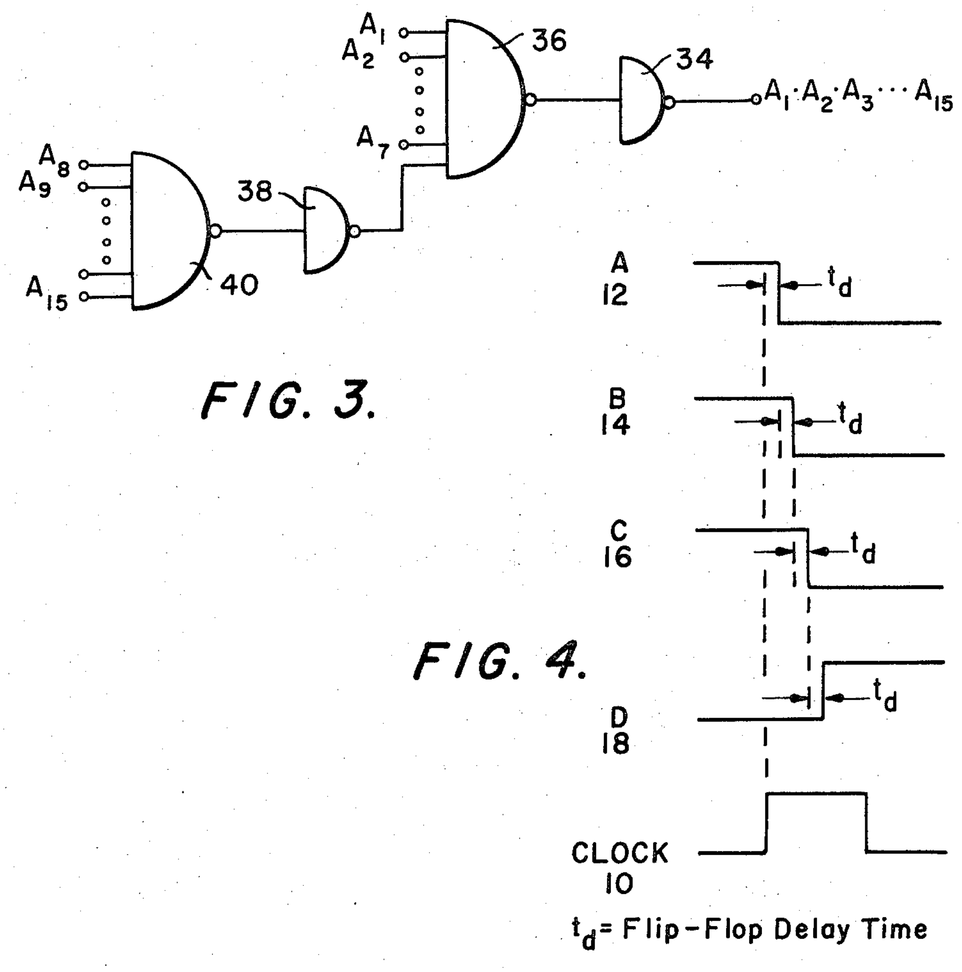
FIG. 3 is the additional circuitry of FIG. 2 typifying the magnitude and complexity of the solution of the prior art.
FIG. 4 is a timing diagram particularly pointing out the flip-flop delay times and transition states generated in going from 0111 to 1000 using the counter of FIG. 1.

Referring to FIG. 1, a 4 bit binary counter consisting of D-type flip-flops 12, 14, 16 and 18 are arranged in the well known manner. Flip-flop 12 maintains the LSB (least significant bit) while flip-flop 18 holds the most significant bit. Although outputs from each of the Q terminals are not shown, the count in the counter may be obtained therefrom. As an example of the circuit operation, consider a binary number DCBA where A is the right-most as well as the least significant bit. Let the counter change from state 0111 to the state 1000. The least significant bit changes first in flip-flop A. This results in the next least significant bit B changing; which in turn changes the next which changes the next and so on until the state 1000 is reached. This operation is shown in FIG. 4. Since each bit change requires one flip-flop delay time, $t_d$, a total of four flip-flop delay times are required to complete the change in the counter state. Similarly when considering the change from the state 0100 to 0101 it can be seen that only one flip-flop delay time is required. Thus, considering an $n$-bit ripple through counter of the prior art, a change in counter state can require from one to four flip-flop delays. Also, the change from one state to another inherently produces intermediate or transitional states which are transmitted through the counter and possibly lead to erroneous conditions in other devices utilizing the counter states.

Figure 2:
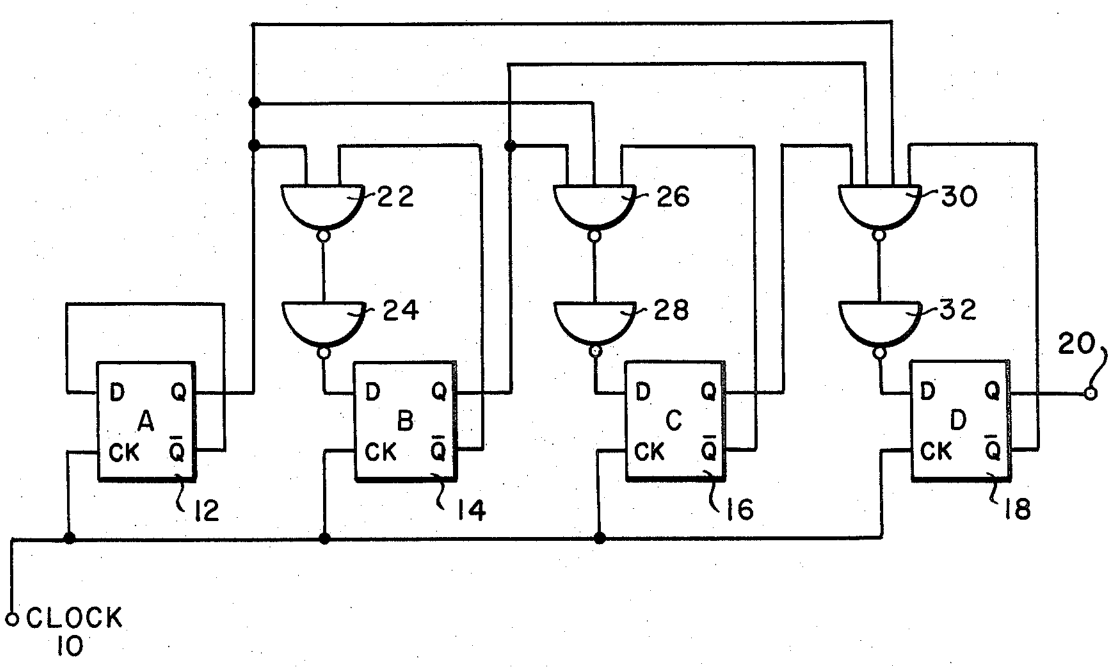
FIG. 2. PRIOR ART

Referring to FIG. 2, a completely synchronous binary counter can be developed by the use of Boolean algebra and common mapping techniques. In effect a set of two NAND gates establishes the criterion that at the positive-going edge of a counter clock pulse from a clock 10 the counter proceeds directly to the next state. Since the logic depends on the present state of the counter and sets up before the next clock pulse, the change to the next state takes place in the delay time of only one flip-flop. A quick perusal of the auxiliary NAND gate structure shows that as the $n$-bit counter becomes larger the progression of NAND gate input size increases. Specifically the NAND gate set, 22 and 24, which service flip-flop 14 must have two inputs, the set 26 and 28 servicing flip-flop 16 must have three inputs. As the progression increases, as typified by FIG. 3, NAND gates 36, 38, and 40 must be cascaded to provide the circuitry of the servicing set. Thus as the $n$-bit counter of the prior art gets larger the size of the auxillary structure also increases.

Figure 5:
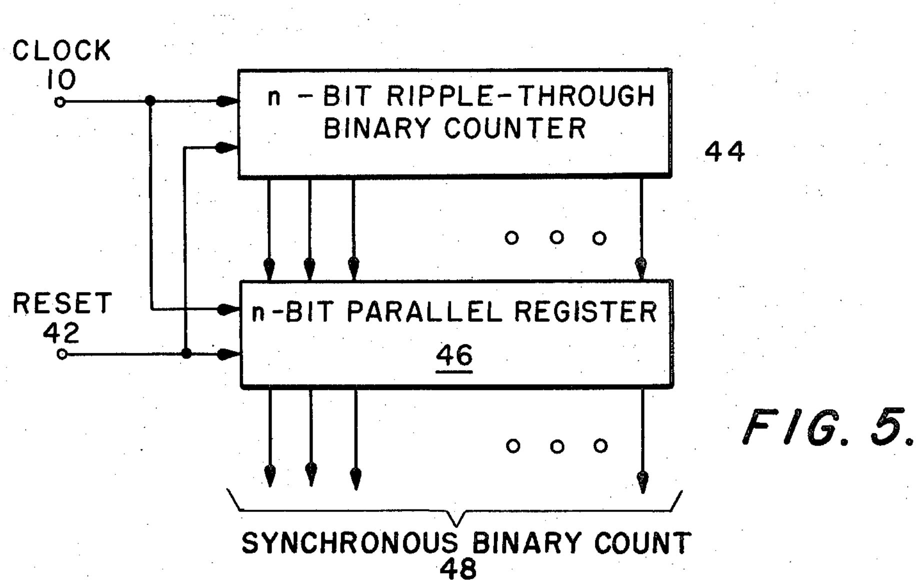
FIG. 5 is a block diagram of the $n$-bit count-and-store synchronous counter.

Referring to block diagram FIG. 5, an effort has been made to accomplish synchronous counting in the manner which is substantially equivalent to the method of counting employed by the structure of FIG. 2 while maintaining the circuit simplicity of FIG. 1. It will be noted that $n$-bit ripple through counter 44 is coupled to an $n$-bit parallel register 46. The term register is used here in the broad sense as a device which stores a code or count for subsequent use. The output of synchronous binary count 48 is provided from the $n$-bit parallel register with the LSB to the left. The counter reset input 42 sets the LSB counter stage to a logical 1 and all other stages to a logical 0. The $n$-bit parallel register reset sets all the register stages to logical 0. Each clock pulse synchronously transfers the state of the binary counter to the parallel register and then updates the state of the counter. The data from the counter 44 is accepted by the register 46 at the clock pulse. As an example of the operation, with the counter initially at state 000...001 and other register at 000...000 (which is the preset conditions as described above), the first clock pulse shifts 000...001 into the register and changes the counter state to 000...010. The following clock pulse shifts this state to the register and up-dates the counter to 000...011, and so on upon each successive clock pulse. Thus, with sufficient time allowed between clock pulses to permit the necessary counter ripple, all outputs from the register are presented simultaneously within one flip flop delay time from the clock pulse and exactly follow the states of a binary counter.

Figure 6:
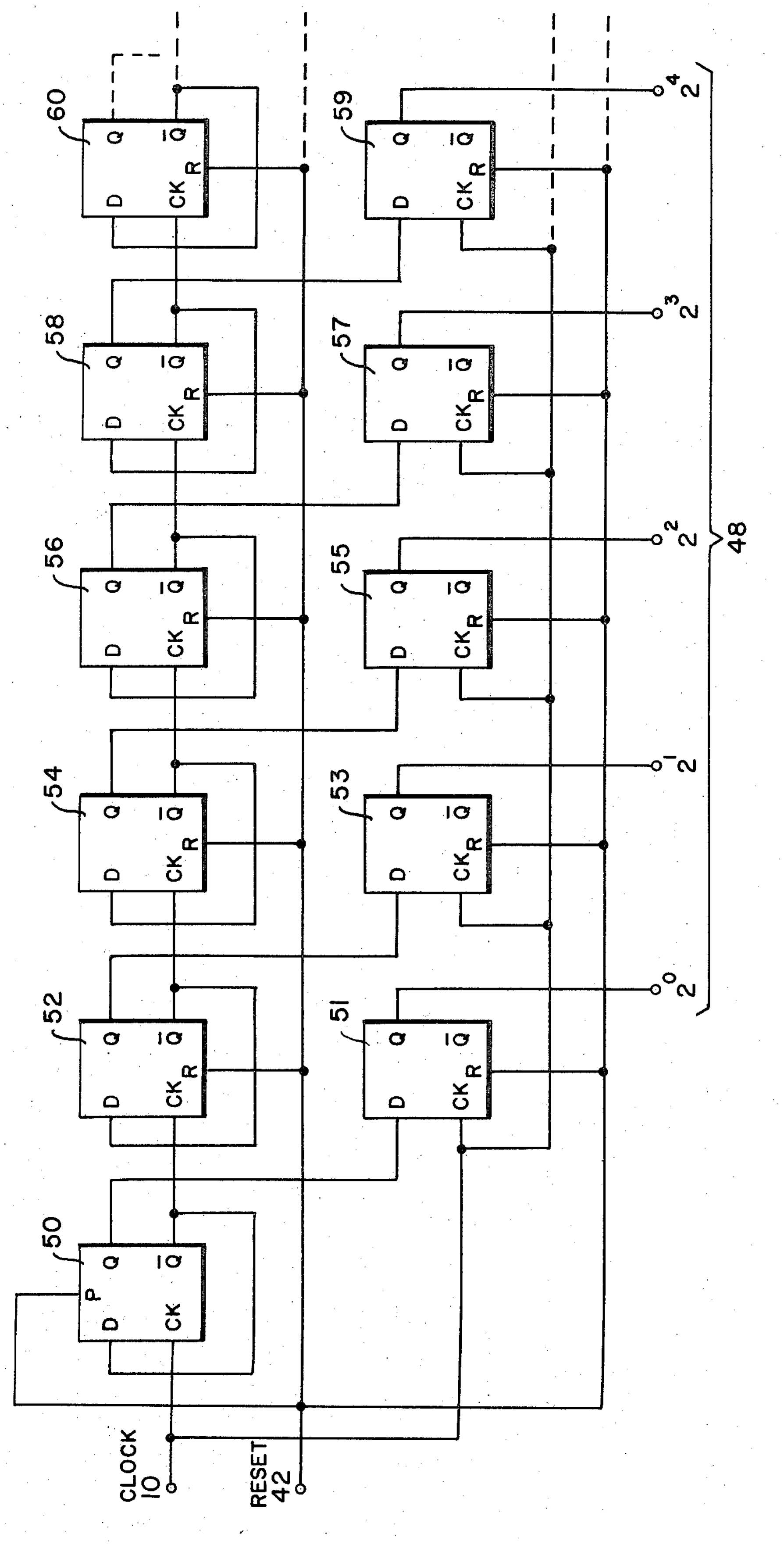
FIG. 6 shows the circuit configuration of the $n$-bit count-and-store synchronous counter.

A logic diagram showing a 6 bit implementation of this technique is shown in FIG. 6. Flip-flops 50, 52, 54, 56, 58 and 60 make up the *n*-bit ripple through counter 44 and flip-flops 51, 53, 55, 57, and 59 are the parallel register 46. All the flip-flops used are common TTL D-type flip flops. Referring to flip flop 50 the reset 42 is connected to terminal P to set that flip flop to a logical 1. All other flip flops of the ripple through counter are set to 0 by reset 42 through the R terminal. Also, the flip-flops of the *n*-bit parallel register are set to 0 by means of their R input terminals.

Obviously many modifications are possible in light of the above teachings. It is therefore to be understood that within the scope of the appended claims the invention may be practiced otherwise than as specifically described.

What is claimed and desired to be secured by Letters Patent of the United States is:

1. A system for counting and storing the number of pulses at an input comprising:

a ripple through binary counter connected to said input to count the pulses received;

said counter comprising an *n*-bit ripple through binary counter including a first plurality of flip-flops;

storing means connected to said input and to said counter for storing the count in said counter each time a pulse is received;

said storing means comprising an *n*-bit parallel register including a second plurality of flip-flops all connected directly to said input with the output of each of said first plurality of flip-flops connected to the input of one of said second plurality of flip-flops;

reset means for introducing a reset pulse into said system, wherein;

the reset terminals of all of said second plurality of flip-flops and of all of said first plurality of flip-flops except the lowest digit flip-flop are connected to receive said reset pulse; and, the preset terminal of said lowest digit flip-flop is connected to receive said reset pulse, whereby said lowest digit flip-flop is set to logical 1 and all the other flip-flops are set to logical 0 upon receipt of a reset pulse.

2. The system as claimed in claim 1 wherein said first and second plurality of flip-flops are D type flip-flops.

* * * * *